United States Patent [19]

Leupold

[11] Patent Number: 5,396,209

[45] Date of Patent: Mar. 7, 1995

[54] LIGHT-WEIGHT MAGNETIC FIELD SOURCES HAVING DISTORTION-FREE ACCESS PORTS

[75] Inventor: Herbert A. Leupold, Eatontown, N.J.

[73] Assignee: The United States of America as represented by the Secretary of the Army, Washington, D.C.

[21] Appl. No.: 197,044

[22] Filed: Feb. 16, 1994

[51] Int. Cl.$^6$ .......................... H01F 7/02; G01V 3/00; H01S 3/00

[52] U.S. Cl. .................................. 335/306; 324/318; 372/2

[58] Field of Search ............... 335/297, 298, 302, 306, 335/210, 212; 315/5.34, 5.35, 4, 5; 372/2; 324/318

[56] References Cited

U.S. PATENT DOCUMENTS

| | | |
|---|---|---|
| H591 | 5/1989 | Leupold . |
| 4,614,930 | 9/1986 | Hickey ................ 335/302 |
| 4,758,813 | 7/1988 | Holsinger ............ 335/306 |
| 4,829,277 | 5/1989 | Stahura ............... 335/306 |
| 4,835,506 | 5/1989 | Leupold . |
| 4,837,542 | 6/1989 | Leupold . |
| 4,839,059 | 6/1989 | Leupold . |
| 4,862,128 | 8/1989 | Leupold ............... 335/306 |
| 4,999,600 | 3/1991 | Aubert ................. 335/306 |
| 5,103,200 | 4/1992 | Leupold . |
| 5,216,400 | 6/1993 | Leupold ............... 335/306 |
| 5,216,401 | 6/1993 | Leupold . |
| 5,300,910 | 4/1994 | Unkelbach ........... 335/306 |

OTHER PUBLICATIONS

Leupold et al, "Novel High-Field Permanent-Magnet Flux Sources", IEEE Transactions on Magnetics, vol. MAG-23, No. 5, pp. 3628-3629, Sep. 1987.

Leupold et al, "A Catalogue of Novel Permanent-Magnet Field Sources", Paper No. W3.2, 9th International Workshop on Rare-Earth Magnets and Their Applications, pp. 109-123, Aug. 1987, Bad Soden, FRG.

Leupold et al, "Design applications of magnetic mirrors", Journal of Applied Physics, 63(8), 15 Apr. 1988, pp. 3987-3988.

Leupold et al, "Applications of yokeless flux confinement", Journal of Applied Physics, 64(10), 15 Nov. 1988, pp. 5994-5996.

Abele et al, "A general method for flux confinement in permanent-magnet structures", Journal of Applied Physics, 64(10), 15 Nov. 1988, pp. 5988-5990.

Primary Examiner—Leo P. Picard
Assistant Examiner—Stephen T. Ryan
Attorney, Agent, or Firm—Michael Zelenka; James A. DiGiorgio

[57] ABSTRACT

A light-weight permanent magnet structure having a permanent magnet shell that generates a high-intensity internal magnetic field that can be accessed without disrupting the uniformity of that internal field. Particularly, the permanent magnet shell is comprised of permanent magnet material that has a uniform magnetization at each polar angle around the shell, such that its size is minimized in regions where less than the maximum available magnetization of the material is required to maintain the internal field intensity. The resultant structure is a lightweight, low profile, low-cost distortion-free flux source that is easier to construct than the prior art.

3 Claims, 3 Drawing Sheets

LIGHT-WEIGHT MAGNETIC FIELD SOURCES HAVING DISTORTION-FREE ACCESS PORTS

GOVERNMENT INTEREST

The invention described herein may be manufactured, used, and licensed by or for the Government for governmental purposes without the payment to me of any royalty thereon.

BACKGROUND OF THE INVENTION

The present invention relates to high-field permanent magnets. More specifically, it relates to permanent magnet structures that provide internal uniform magnetic fields that can be accessed through non-distorting access ports.

One of the most critical problems confronting designers of high-intensity internal magnetic field sources has been accessing the internal field without distorting it. More specifically, those skilled in the art know that drilling an access port in the shell of a magnetic structure that produces an internal magnetic field can significantly distort the uniformity of that internal field.

The following references show many types of magnetic structures that can be utilized for such purposes:

Leupold, U.S. Pat. No. 4,835,506, issued May 30, 1989, entitled "Hollow Substantially Hemispherical Permanent Magnet High-Field Flux Source;"

Leupold, U.S. Pat. No. 4,837,542, issued Jun. 6, 1989, entitled "Hollow Substantially Hemispherical Permanent Magnet High-Field Flux Source for Producing a Uniform High Field;"

Leupold, U.S. Pat. No. 4,839,059, issued Jun. 13, 1989, entitled "Clad Magic Ring Wigglers;"

Leupold, U.S. Statutory Invention Registration H591, published May 7, 1989, entitled "Method of Manufacturing of a Magic Ring;"

Leupold et al., "Novel High-Field Permanent-Magnet Flux Sources," *IEEE Transactions on Magnetics*, vol MAG-23, No. 5, pp. 3628-3629, Sept. 1987;

Leupold et al., "A Catalogue of Novel Permanent-Magnet Field Sources," *Paper No W3.2, 9th International Workshop on Rare-Earth Magnets and Their Applications*, pp 109-123, Aug. 1987, Bad Soden, FRG;

Leupold et al., "Design applications of magnetic mirrors," *Journal of Applied Physics*, 63(8), Apr. 15, 1988, pp. 3987-3988; Leupold et al., "Applications of yokeless flux confinement," *Journal of Applied Physics*, 64(10), Nov. 15, 1988, pp. 5994-5996; and Abele et al., "A general method for flux confinement in permanent-magnet structures," *Journal of Applied Physics*, 64(10), Nov. 15, 1988, pp. 5988-5990.

Leupold, U.S. Pat. No. 5,103,200, issued Apr. 7, 1992, entitled "High-Field Permanent Magnet Flux Source."

These references show many different permanent-magnet structures. Each structure is comprised of a permanent magnet shell that produces a uniform magnetic field of unusually high intensity in an internal cavity. This internal field is accessed through port holes drilled through the structure's shell at predetermined locations. These port holes in the permanent magnet shell, however, disrupt the uniformity of the shell's magnetization, and thus distort the internal field. Consequently, these structures are unacceptable for high precision applications.

One solution to this distortion problem was recently presented by the present inventor in U.S. Pat. No. 5,216,401, entitled, MAGNETIC FIELD SOURCES HAVING NON-DISTORTING ACCESS PORTS, issued Jun. 1, 1993, and incorporated herein by reference. Generally, this patent discloses a technique for altering a prior art flux source such that it provides distortion-free access to its internal uniform magnetic field. More specifically, the size, shape and composition of the shell of an original structure was altered such that the resultant shell produced an internal field having virtually the same magnitude as the original structure, but with non-magnetized shell material at the location where the access ports were drilled. As a result, this non-magnetized material could be removed from the resultant shell without affecting the uniformity and magnitude of the internal field.

The resultant shell, however, required additional permanent magnet material in regions away from the port holes in order to maintain the magnitude of the resultant internal field to be substantially the same as that of the original structure. If this extra magnetic material was not added, the internal field strength would be compromised. Moreover, the resultant shell required the assembly of a plurality of magnetic components having dissimilar magnetization from each other. As a result, structures disclosed under this technique is expensive and difficult to construct.

A pictorial view of the virtual composition of one such structure is shown in FIG. 1. As shown, resultant structure 30 is virtually formed by adding a uniformly magnetized altering-shell M2 to shell M1 of original structure 10. Note that this is not the actual procedure for constructing structure 30, it is only a mathematic rendition of how original structure 10 is altered to design structure 30. As described above, resultant shell 31 is comprised of a plurality of permanent magnet components having dissimilar magnetization magnitudes, some of which are several times the size and weight as the magnetization components comprising original structure 10.

Consequently, this technique is undesirable for those applications where space is at a premium, and where magnetic materials are scarce. As a result, those skilled in the art strongly desire an easier-to-construct, smaller, less-costly magnetic field source that can provide such distortion-free access to an internal field. The present invention fulfills this need.

SUMMARY OF THE INVENTION

Accordingly, it is an object of this invention to provide a light-weight permanent magnet structure having a high-intensity internal magnetic field that can be accessed without disrupting the uniformity and strength of that internal field. Particularly, the invention utilizes an improved shell-altering technique to create such structures that can be constructed with as little as one predetermined permanent magnet material having a predetermined uniform magnetization. Moreover, the magnetization of the permanent magnet material comprising the resultant shell is chosen so that only the minimum amount of material is needed to maintain the resultant structure's internal field the same as the original structure. This further reduces the size, weight and cost of the resultant structure over the prior art.

More specifically, the invention utilizes a technique that alters the shell thickness of an original flux source structure to vary as a function of the polar angle ($\phi$) around its circumference such that the overall size and shape of the resultant shell is minimized. The resultant shell's size and shape is directly proportional to the magnitude of its internal field (Bw), divided by the shell material magnetization (Br), multiplied by 2*sin($\phi$). Where "$\phi$" is the polar angle around the resultant shell's circumference.

The complete mathematical relationship is shown in Equation 1, below.

$$ln\ R = (Bw/Br) * (2*Sin\phi) \quad (1)$$

Since "ln R" is the natural-log of the ratio of the shell's outer-radius to its inner-radius, the resultant shell can be any desired shape and size, limited only by the magnetization of the material used to construct the shell (Br) and the desired strength of the resultant internal field (Bw). This technique can be applied to both spherical and ring shaped permanent magnet structures similar to those described as prior art above.

In one embodiment of the invention, the shell of a spherical magnetic structure having equatorial access is altered such that its internal field strength is maintained and its overall shell size is minimized. The resulting structure is a prolate spheroid having two non-distorting access ports, using much less material than the prior art. See, FIG. 2. "Prolate" designates the shape of a solid, especially a spheroid, with a polar axis longer than its equatorial diameter.

In another embodiment, the shell of a spherical magnetic structure having polar access is altered such that the internal field strength is maintained and the overall shell size is minimized. The resulting structure is an oblate spheroid having two non-distorting access ports, using much less material than the prior art. See, FIG. 3. "Oblate" designates the shape of a spheroid that is compressed along or flattened at the poles (such that the polar axis is less than the equatorial diameter).

The exact nature of this invention, as well as other objects and advantages thereof, will be readily apparent from consideration of the following specification when taken with the drawings. The scope of the invention, however, is limited only by the claims appended hereto.

DESCRIPTION OF THE PREFERRED EMBODIMENT

Figure 1:
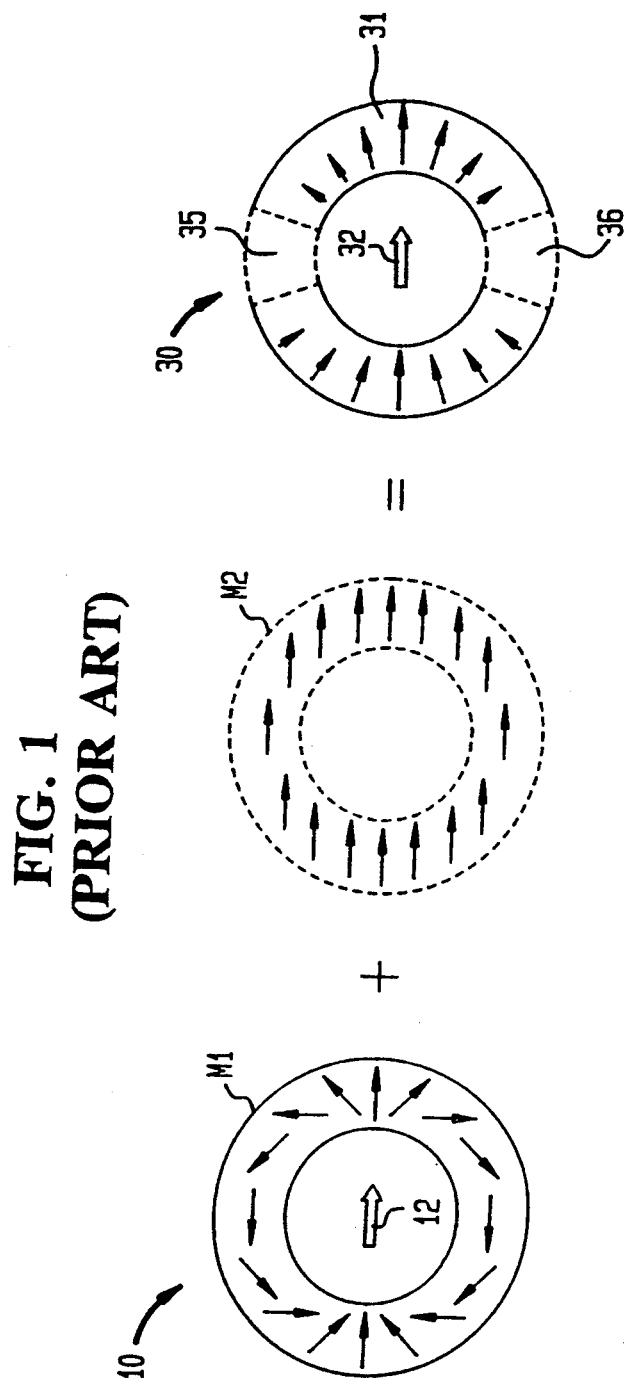
FIG. 1 is a pictorial view, in cross section, of the prior art technique for building a magnetic field source having non-distorting access ports.

Referring now to FIG. 1, there is shown a pictorial view of the prior art technique for building a magnetic flux source 30 having non-distorting access ports 35 and 36 that lead to internal magnetic field 32 which is the same as internal field 12 of original structure 10. As described above, FIG. 1 merely shows a pictorial rendition of the mathematics in designing resultant shell 31, not the actual method of construction. As shown, resultant structure 30 is essentially formed by adding a uniformly magnetized altering-shell M2 to original flux-source shell M1 of original structure 10. As a result, internal field 32 can be accessed through ports 35 and 36 without distorting internal field 32. The drawback, however, is that the size of resultant shell 31 has to be substantially larger than original shell M1 in order for resultant internal field 32 to be substantially the same as original internal field 12. As a result, resultant structure 30 is much more costly than original structure 10.

Consequently, this technique for providing distortion-free access to a preserved internal field is costly and inefficient. Moreover, this technique is difficult to employ because the actual construction of resultant shell 31 would require assembling a plurality of magnetic materials each having a different magnetization. Therefore, those skilled in the art greatly desire a less expensive, more streamline, easy to build magnetic field source that can provide distortion-free access to its internal field. The present invention fulfills this need.

Figure 2A:
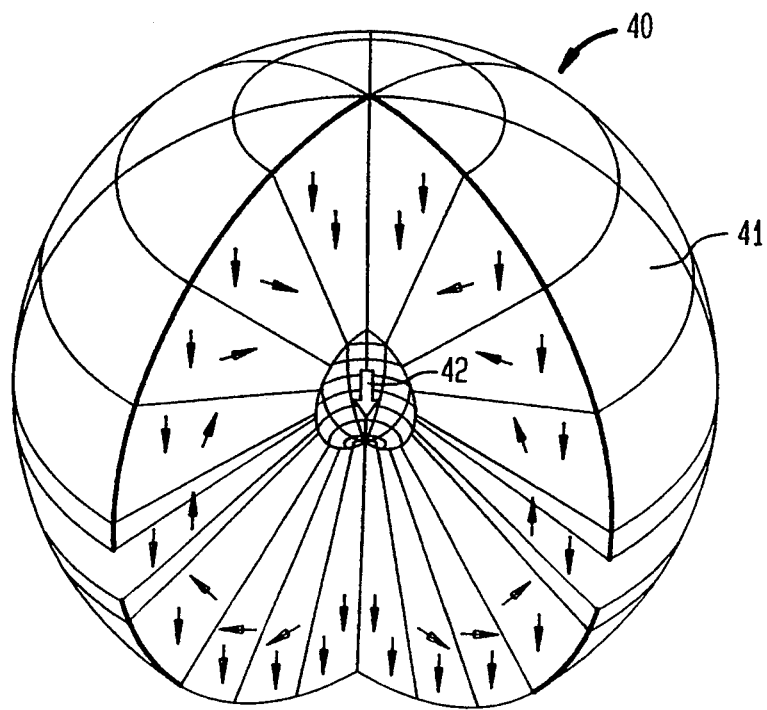
FIG. 2 is a pictorial view of an embodiment of the invention showing a spherical magnet structure, having an equatorial axis, that is minimized such that a prolate spheroid is formed.

Referring now to FIG. 2(a) and (b), there is shown a preferred embodiment of the invention, structure 50. Structure 50 is the result of altering original structure 40 according to the inventive technique taught herein. Resulting structure 50 is a magnetic field source having a shell 52 shaped like a prolate spheroid. Note that, due to the removal of shell material for access ports 55 and 56, the equatorial crease of the prolate spheroid is not shown. The benefit of this structure is that resultant shell 52 provides internal field 51 having the same magnitude as the original structure with less material, and thus less cost. Moreover, resultant shell 52 is comprised of only one permanent magnet material having a uniform predetermined magnetization. As a result, resultant shell 52 is much easier to construct than the original structure's shell.

The magnetization and shape of resultant structure 50 is best described mathematically. As disclosed above, the magnetization (Bw) of internal field 51 depends on the magnetization (Br), the shape, and the size of the magnetic material comprising resulting shell 52. More specifically, the magnetization (Bw) of internal field 51 is equal to the sum of the product of the magnetization and size of each permanent magnet component (Br) comprising resultant shell 52. Equation 2 fully describes this relationship.

$$Bw = \Sigma Br * ln\ R \quad (2)$$

Where "ln R" is the natural-log of the ratio of the shell outer radius to its inner radius.

Since resultant internal magnetization (Bw) of internal field 51 is predetermined (same as original flux source), the thickness or shape of resultant shell 52 varies as a function of the polar angle ($\phi$) of structure 50. More specifically, the ratio of the outer radius to inner radius (R) is directly proportional to sine $\phi$, as shown in Equation 3, below.

$$ln\ R(\phi) = (Bw/Br) * (2*Sin(\phi)) \quad (3)$$

Consequently, resultant structure 50 provides the desired non-distorting access ports 55 and 56, but with a smaller, lighter and less expensive flux source shell 52, while maintaining the strength of internal field 51.

Figure 2B:
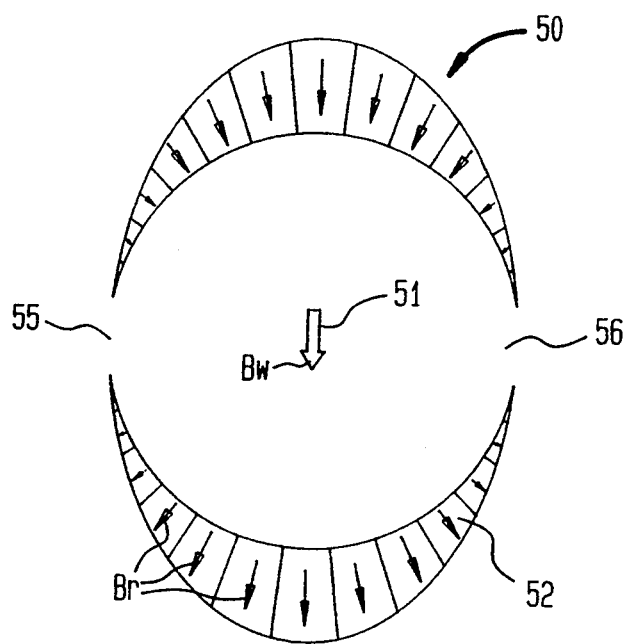
Figure 3A:
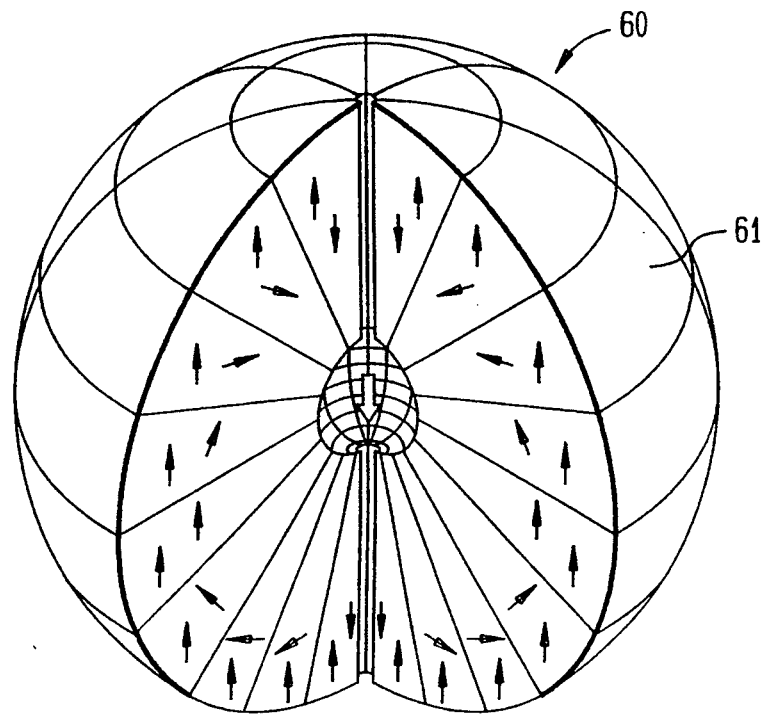
FIG. 3 is a pictorial view of another embodiment of the invention showing a spherical magnet structure, having a polar axis, that is minimized such that an oblate spheroid is formed.
Figure 3B:
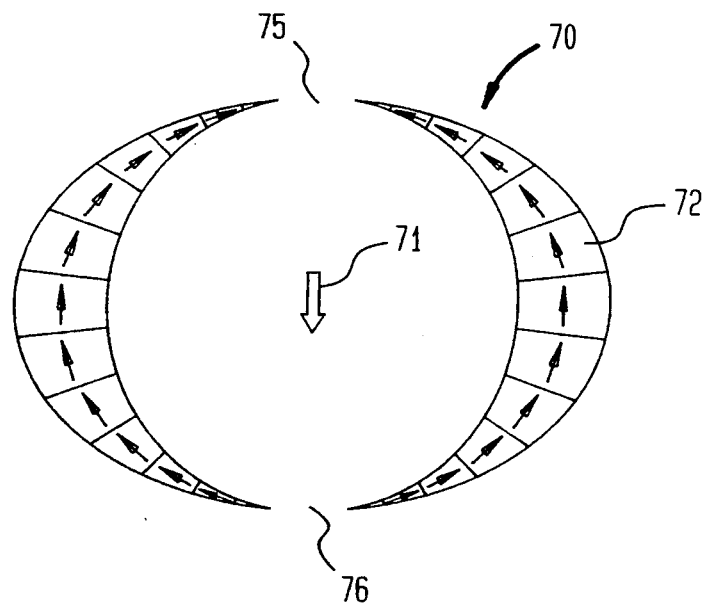

In another embodiment of the invention, shown in FIG. 3, the disclosed technique is utilized to alter a polar spherical high-field flux source 60 (See FIG. 3(a)) to create oblate spheroid 70. As shown, oblate spheroid 70 has access ports 75 and 76 that communicate with internal field 71. As with shell 52 of embodiment 50 in FIG. 2, shell 72 is designed to provide non-distorting access to a non-diminished internal field 71 in accordance with the above equations. As a result, structure 70 provides the desired non-distorting access ports 75 and 76, but with a smaller, lighter and less expensive shell 72, while having no reducing effect on internal field 71. Note that due to the shell material removed for access ports 75 and 76 the polar dimples of oblate spheroid 70 are not shown.

In light of the above teachings, many other variations of the present invention are possible. For example, the inventive technique may be applied to a variety of other magnetic flux sources, such as a magic ring, to produce many other resultant structures having different predetermined shapes and sizes. It is therefore understood that within the scope of the applied claims, the invention may be practiced otherwise than specifically described.

What is claimed is:

1. A permanent magnet structure of the type having a permanent magnet shell that produces an internal magnetic field that can be accessed through non-distorting access ports passing through said shell, the improvement comprising:

said shell having a shape and size that varies as a function of the polar angle of rotation around said structure, said size and shape of said shell varying as a function of e having an exponent that is directly proportional to the magnitude of said internal magnetic field divided by the magnetization of the material comprising said shell multiplied by the Sine of said polar angle, said shell comprising a predetermined permanent magnet material having a uniform magnetization at each said polar angle around said structure such that said shell size and shape is minimized at each said polar angle.

2. The permanent magnet structure of claim 1 wherein said permanent magnet shell has an oblate spheroid shape, and wherein said access ports pass through the poles of said shell.

3. The permanent magnet structure of claim 1 where in said permanent magnet shell has a prolate spheroid shape, and wherein said access ports pass through the equatorial axis of said shell.

* * * * *